(12) United States Patent
Gurer et al.

(10) Patent No.: US 6,177,133 B1
(45) Date of Patent: Jan. 23, 2001

(54) METHOD AND APPARATUS FOR ADAPTIVE PROCESS CONTROL OF CRITICAL DIMENSIONS DURING SPIN COATING PROCESS

(75) Inventors: Emir Gurer, Scotvalley; Richard Savage, Livermore, both of CA (US)

(73) Assignee: Silicon Valley Group, Inc., San Jose, CA (US)

( * ) Notice: Under 35 U.S.C. 154(b), the term of this patent shall be extended for 0 days.

(21) Appl. No.: 08/988,288

(22) Filed: Dec. 10, 1997

(51) Int. Cl.$^7$ .................................................. B05D 3/12
(52) U.S. Cl. ........................................ 427/240; 427/385.5
(58) Field of Search .................. 427/240, 385.5

(56) References Cited

U.S. PATENT DOCUMENTS

| | | | |
|---|---|---|---|
| 4,748,053 | 5/1988 | Okada | 427/240 |
| 4,996,080 | 2/1991 | Daraktchiev | 427/57 |
| 5,250,116 | 10/1993 | Tanimoto | 118/664 |
| 5,366,757 | 11/1994 | Lin | 427/9 |
| 5,405,813 | 4/1995 | Rodrigues | 437/231 |
| 5,468,514 | 11/1995 | Tomita | 427/77 |
| 5,536,534 | 7/1996 | Bae | 427/375 |
| 5,670,210 | 9/1997 | Mandal et al. | 427/240 |

*Primary Examiner*—Shrive Beck
*Assistant Examiner*—Jennifer Calcagni
(74) *Attorney, Agent, or Firm*—Wilson Sonsini Goodrich & Rosati

(57) ABSTRACT

A spin coating process for controlling the mean thickness of photoresist on the surface of a semiconductor wafer. The wafer surface has a central axis normal to the surface. The process comprises the steps of applying the solution to the wafer surface and spinning the wafer about the central axis at a spindle speed until the solution has dried. The spindle speed is a function of the desired mean thickness of the photoresist, the barometric pressure and the relative humidity. The spindle speed is determined from a statistical model described by the equation:

$$MT = A + B \times RH + C \times BP + D/SS^{1/2}$$

wherein:
MT is mean thickness in Å;
RH is relative humidity in percent;
BP is barometric pressure in mm of Hg;
SS is spindle speed in rpm; and
A, B, C and D are constant coefficients.

5 Claims, 3 Drawing Sheets

METHOD AND APPARATUS FOR ADAPTIVE PROCESS CONTROL OF CRITICAL DIMENSIONS DURING SPIN COATING PROCESS

FIELD OF THE INVENTION

This invention relates to an improved system and process for coating semiconductor wafers with photoresist polymer solution. In particular, this invention relates to a process control apparatus and method for improving coating thickness control of photoresist coatings on semiconductor wafers which improves line width control of device features.

BACKGROUND OF THE INVENTION

The manufacture of integrated circuits involves the transfer of geometric shapes on a mask to the surface of a semiconductor wafer. Thereafter the semiconductor wafer corresponding to the geometric shapes or corresponding to the areas between the geometric shapes is etched away. The transfer of the shapes from the mask to the semiconductor wafer typically involves a lithographic process. This includes applying a photosensitive pre-polymer solution to the semiconductor wafer. The solvent in the pre-polymer solution is removed by evaporation, and the resulting polymer film is then baked. The film is exposed to radiation, for example ultraviolet light, through a photomask supporting the desired geometric patterns. The images in the photosensitive material are then developed by soaking the wafer in a developing solution. The exposed or unexposed areas are removed in the developing process, depending on the nature of the photosensitive material. Thereafter the wafer may undergo a wet etch process in an etching solution, or a dry plasma etch process. Both the wet and dry etch processes etch away the areas not protected by the photosensitive material. Due to their resistance to the etching process, the photosensitive materials are also known as photoresists. These may for instance be sensitive to ultraviolet light, electron beams, x-rays, or ion beams.

The high cost of the photoresist pre-polymer solutions makes it desirable to devise methods of improving the efficiency of the coating process so as to minimize the polymer solution's consumption. Furthermore, thickness control and uniformity of the photoresist layer is an important criterion in the manufacture of integrated circuits. It ensures satisfactory reproduction of the geometric patterns on the semiconductor wafer. With the requirement for smaller dimensions, the photolithography processes have shifted to using light with shorter wavelengths and a resulting smaller depth of focus. Variations in thickness over the surface of the wafer and variations in thickness from one wafer to the next introduce non-reproducible variations in photoresist exposure and consequent non-reproducible variations in the ultimate details of the product which limit the possible size reductions.

Critical dimension (CD) control becomes more difficult with smaller feature sizes in which the line width is to be maintained, for example, within ten percent of the feature size. This problem will increase in importance in future devices with smaller feature sizes. For example, the speed of microprocessor and memory devices is strongly determined by the line width control of the critical dimensions. A chip with improved line width control can operate at higher frequencies due to smaller capacitive and resistive losses. One method of achieving improved CD control, i.e. line width control, is by means of thickness control of the photoresist.

Convective diffusion and evaporation are two strongly coupled mass transfer mechanisms that determine film thickness uniformity profiles of spin coated photoresist films. Convective diffusion is the dominant thinning mechanism during the first few seconds of spin coating. Even though the evaporation mechanism starts out two orders of magnitude smaller during the initial moments of dispense, its nonzero and constant value causes viscosity of the resist material to increase dynamically, thus decreasing the convective diffusion of the photoresist. Subsequently, evaporation becomes the dominant mechanism which eventually determines the dry film thickness profile. The thinning rate due to evaporation starts to decrease eventually due to lowered diffusivity of the remaining solvents. This strong dependence of the spin coating process on the evaporation mechanism requires today's modem wafer tracks to tightly control evaporation related physical parameters. Tightening of the electrical and/or mechanical control specifications on equipment contributes to the spiraling cost of processing wafers and may well limit the mean thickness control capability required by future generation devices since mechanical tolerances on equipment will not alleviate required process variances. Thus, an alternative approach is needed to achieve consistently more stringent process latitudes.

We have discovered that changes in barometric pressure and relative humidity, as well as variations in photoresist solution temperature, wafer temperature and ambient temperature introduce coating variations in the spin-coating process which account for much of the variations experienced in spin coating wafers. While temperatures can be controlled by traditional sensors and feed-back systems, and relative humidity can be controlled by providing an enclosed system, barometric pressure fluctuations are beyond control unless one places the entire processor in a pressure chamber, an impractical approach.

SUMMARY OF THE INVENTION

This invention is based on a revolutionary and dynamic approach to process control by adapting the process to the changes in environmental variables which provides a remarkable increase in coating thickness control and coating uniformity which, in turn, improves the feature size control. In this invention, barometric pressure and relative humidity are measured and the measured values are input to a model which calculates a drying spin speed corresponding to the measured environmental values. This new spin speed is then communicated to the spindle controller to adjust the spin speed from a nominal value in order to control the mean resist film thickness.

The invention pertains to a spin coating process for coating a wafer surface with a solution, the surface having a central axis normal thereto. The process comprises the steps of applying the solution to the wafer surface, and spinning the wafer about the central axis at a spindle speed until the solution has dried. The mean thickness of the solution is a function of the relative humidity, barometric pressure, and spindle speed during drying. The physics of spin coating predicts that the mean thickness is proportional to the inverse square root of the spin speed, and linearly dependent on relative humidity and barometric pressure, and can be modeled according to the following equation:

$$MT = A + B \times RH + C \times BP + D/SS^{1/2}$$

wherein:

MT is mean thickness in Å;

RH is relative humidity in percent;

BP is barometric pressure in mm of Hg;

SS is spindle speed in rpm; and

A, B, C and D are constant coefficients.

Therefore, the desired spindle speed, at a known relative humidity and a known barometric pressure, can be determined for a desired mean thickness by solving the above equation for SS.

$$SS = (D/(MT - A - B \times RH - C \times BP))^2$$

Barometric pressure is not controllable, and varies at a slow rate. The time constant for the barometric pressure to change significantly to have an impact on thickness may be days or weeks. Therefore, the methodology of the above model can be used without including barometric pressure in instances where it is known that the change in barometric pressure will not be significant. The effect on the above equation would be to combine the constant product C×BP into the constant A coefficient.

DETAILED DESCRIPTION OF THE INVENTION

In the reduction of distances between lines in semiconductor devices, the limitations resulting from the photolithography processes are being overcome by using light of shorter wavelengths including the far ultraviolet to expose the photoresist coating. With this shift, it is imperative that the coating thickness be uniform over the entire wafer because variations in thickness cause differences in result because a focal length selected for optimum exposure of one portion of the film will not be as effective for other portions having a thicker or thinner thickness. With the presently available photolithography devices, a fixed focal distance is applied to the entire wafer, and no variations are possible to accommodate variations in coating thickness. It is impractical to reset the focal distance for each die location within a wafer and from wafer to wafer. A constant, controlled photoresist coating thickness is required from wafer to wafer to be exposed by the equipment. Failure to achieve precision in the exposure results in loss of sharpness of the image and loss of line and edge definition in the final product, frustrating the efforts to improve these aspects of the process and product.

In investigating the sources of variations in resist film coating thickness and uniformity, we have discovered that substantial improvements in resist film thickness control to yield a desired coating thickness can be achieved by altering the rotational speed of the chuck supporting the wafer being coated in response to changes in barometric pressure and changes in relative humidity.

Figure 1:
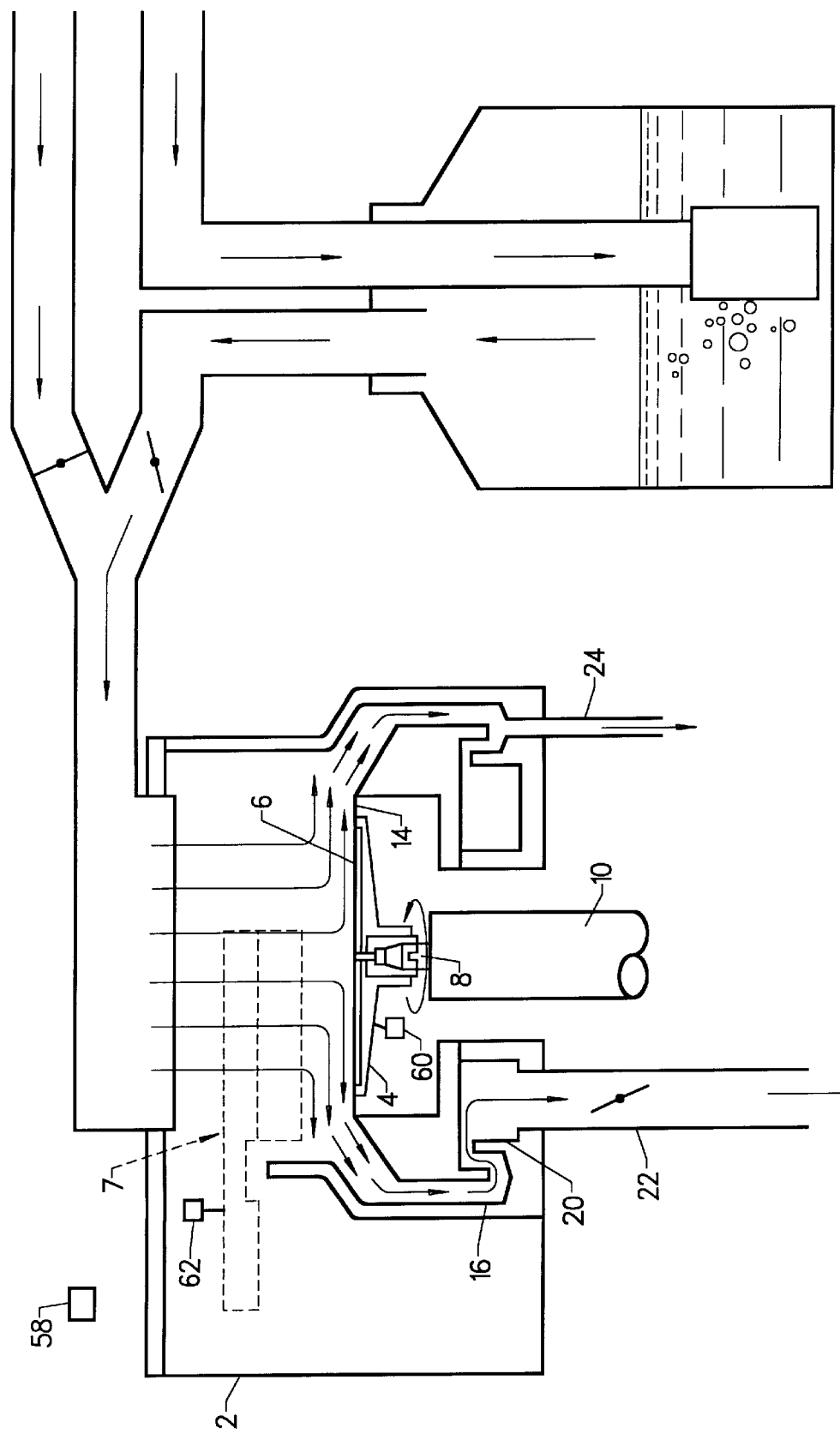
FIG. 1 is a cross-sectional representation of a spin-coating apparatus in which the adaptive process control system of this invention can be used.

FIG. 1 is a cross-sectional representation of a spin-coating apparatus in which the adaptive process control system of this invention can be used. Details of this apparatus and its operation are described in U.S. Pat. No. 5,670,210, the entire contents of which are hereby incorporated by reference.

The spin-coating apparatus includes a housing 2 in which a rotatable support chuck 4 is positioned to support a wafer 6 to be coated. The support chuck 4 is mounted on a spindle 8 connected to a motor (not shown) mounted in a pedestal 10 which is provided with a means to raise and lower the chuck (not shown).

The annular ring 14 is positioned adjacent the wafer chuck 6 to receive excess photoresist liquid flowing off the surface of the wafer 6 during the spinning operation. An annular exhaust chamber 16 receives the photoresist and exhausts process control gases which are directed to the wafer surface by the chamber 18 and directs the exhaust gases to an exhaust chamber 20 and exhaust conduit 22.

During operation of the apparatus, photoresist liquid is applied to the upper surface of the wafer 6 by a photoresist dispensing system 7, and the chuck 4 is spun, removing and spreading the photoresist liquid over the wafer surface by centrifugal force. Excess photoresist solution flows over the annular ring 14 and is captured by the exhaust chamber 16 and removed through photoresist waste conduit 24 communicating therewith.

Figure 2:
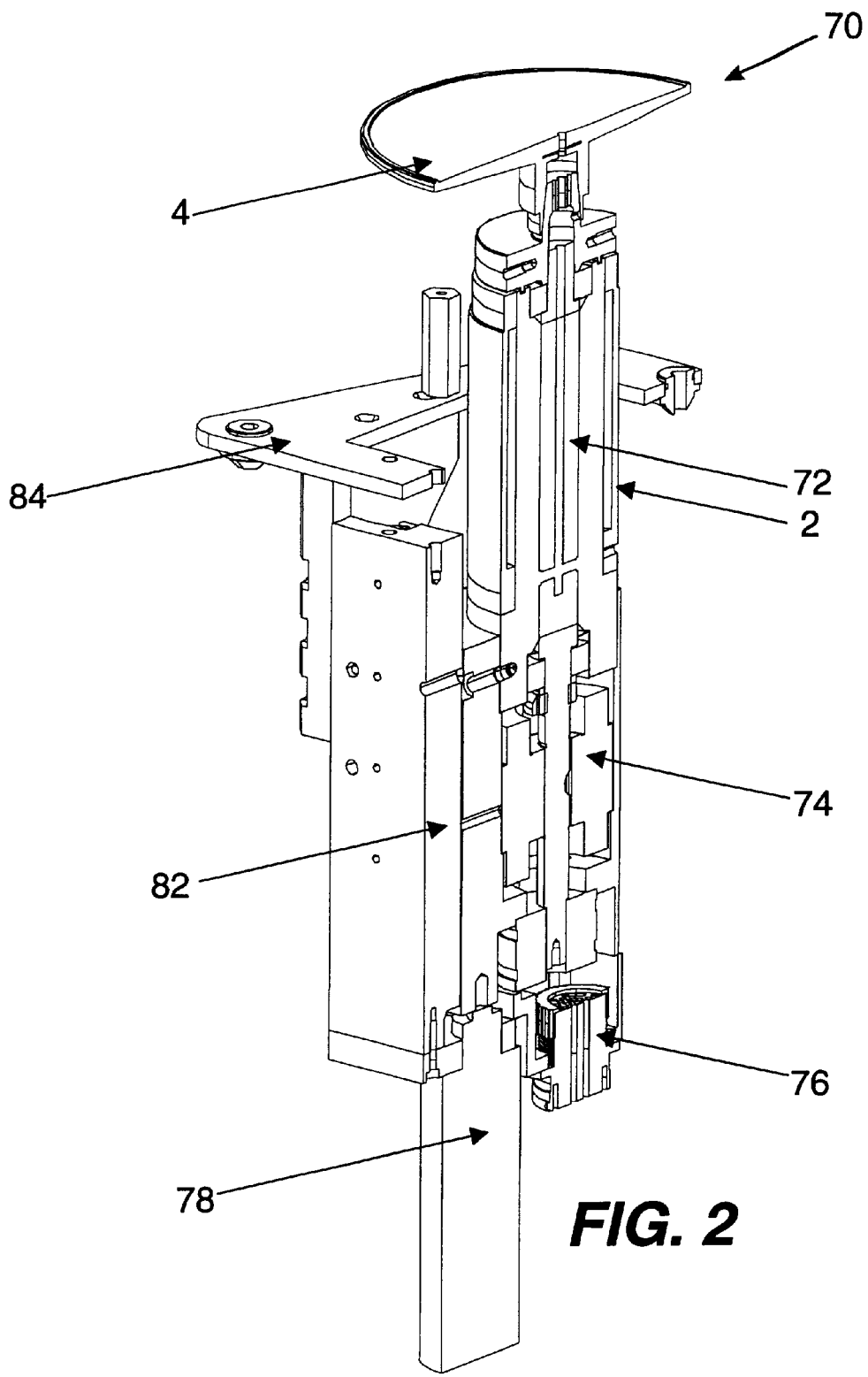
FIG. 2 is a cross sectional view of the spindle and chuck motor assembly of the spin-coating apparatus shown in FIG. 1.

FIG. 2 is a cross sectional view of the spindle and chuck motor assembly 70 of the spin-coating apparatus shown in FIG. 1. The chuck 4 is mounted on the spindle 8. The spindle 8 is coupled to a motor 74 by means of a shaft 72. A mounting bracket 84 provides a means to mount the assembly 70 to the housing 2 (FIG. 1). A z-motion cylinder 78 and slide 82 provide a means to raise and lower the chuck 4. A power coupling 76 provides means to couple electrical power to the motor 74.

The adaptive process control system of this invention may be used with the spin-coating apparatus illustrated in FIGS. 1 and 2 and described in U.S. Pat. No. 5,670,210. It is understood that the adaptive process control system of the invention may be used with other spin-coating apparatus known in the art.

Figure 3:
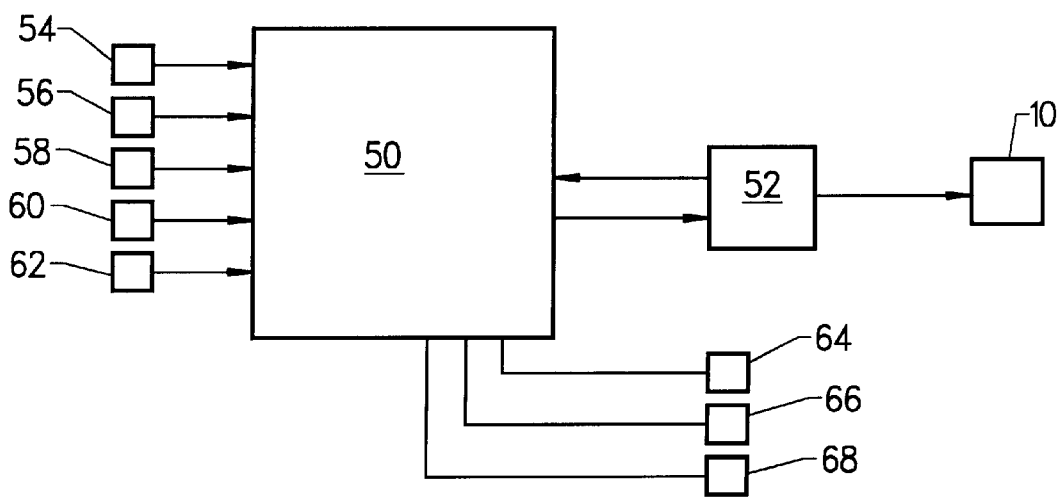
FIG. 3 is a schematic representation of the adaptive process control system of this invention.

FIG. 3 is a schematic representation of the adaptive process control system of this invention. The central processor unit (CPU) 50 can be a conventional desktop computer or work station. The CPU 50 has an input channel and an output channel or port coupled with a spindle controller 52, and the spindle controller 52 has an output coupled with the spindle motor 10.

A conventional barometric pressure sensor 54 is coupled with the central processor 50 to provide signals which are a function of the barometric pressure present in the environment of the spin coating apparatus.

A conventional relative humidity pressure sensor 56 is coupled with the central processor 50 to provide signals which are a function of the humidity surrounding the spin coating apparatus.

A conventional ambient temperature sensor 58 is coupled with the central processor 50 to provide signals which are a function of the ambient temperature of the atmosphere surrounding the spin coating apparatus.

A conventional chill plate sensor 60 is coupled with the central processor 50 to provide signals which are a function of the temperature of the support surface or chill plate of the rotary chuck 4.

A conventional photoresist solution temperature sensor 62 is coupled with an input channel of the central processor 50 to provide signals which are a function of the temperature of the photoresist solution applied to the wafer surface.

An ambient temperature controller 64, chill plate temperature controller 66 and photoresist temperature controller are coupled with respective output channels or ports of the central processor 50. The ambient temperature controller 64 receives control signals in response to signals from the ambient temperature sensor 58 required to maintain the ambient temperature at the ambient set temperature. The chill plate temperature controller 66 receives control signals in response to signals from the chill plate temperature sensor 60 required to maintain the chill plate temperature at the chill plate set temperature. The photoresist temperature controller 68 receives control signals in response to signals from the photoresist temperature sensor 62 required to maintain the photoresist temperature at the photoresist set temperature.

The signals from the barometric pressure sensor 54 and signals from the relative humidity sensor 56 are sampled before the beginning of the coating process, and spin speed adjustment is calculated to accommodate any changes in these conditions from the last wafer coating cycle. The speed adjustment is determined from a statistical model of the mean thickness expressed as a function of relative humidity, barometric pressure and spindle speed. The statistical model is expressed according to the following equation:

EQUATION A:

$$MT = A + B \times RH + C \times BP + D/SS^{1/2}$$

wherein:

MT is mean thickness in Å;

RH is relative humidity in percent;

BP is barometric pressure in mm of Hg;

SS is spindle speed in rpm; and

A, B, C and D are constant coefficients of the model.

The statistical value of the coefficients A, B, C and D are predetermined for each spin coating system and each photoresist polymer solution for a desired polymer coating thickness, by empirical methods, examples of which are shown below.

From the statistical model as expressed by Equation A, at a known set of barometric pressure and relative humidity values, the spin speed to obtain a desired mean thickness can be determined from the following equation:

EQUATION B:

$$SS = (D/(MT - A - B \times RH - C \times BP))^2$$

Referring again to FIG. 3, the value of the spin speed determined from Equation B can be used to send an appropriate speed adjustment signal to the spindle control 52.

Figure 4:
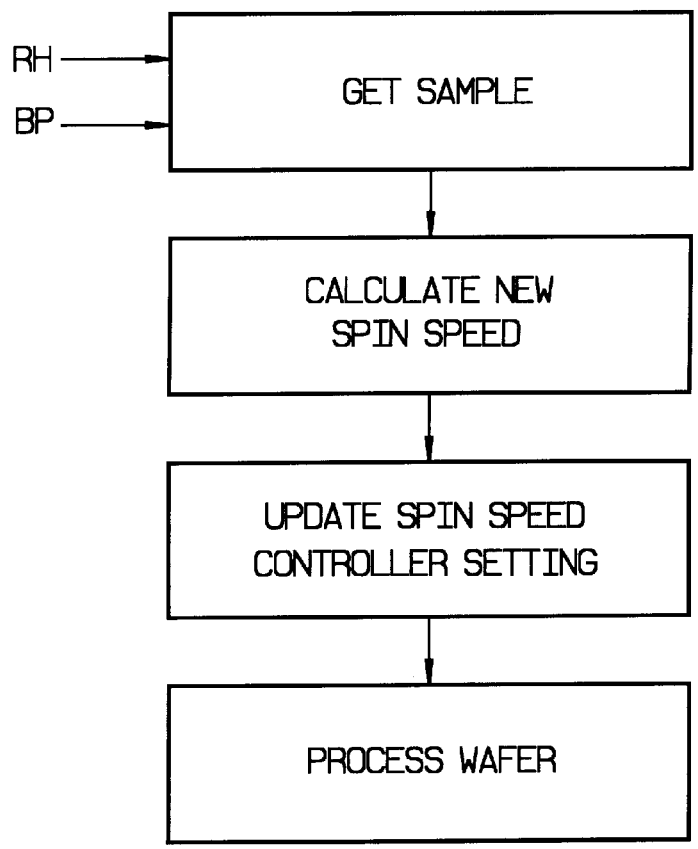
FIG. 4 is a flow chart of the adaptive process control process of this invention.

FIG. 4 is a flow chart of the adaptive process control process of this invention. The wafer coating cycle includes the steps of positioning a wafer on a spin chuck, applying coating the wafer surface, spinning the wafer to distribute the coating over the wafer in a spinning phase and removing any excess photoresist liquid, and evaporation of solvent from the coating. Before the spinning phase of each wafer coating cycle, the relative humidity and barometric pressure are sampled from sensors 54 and 56 with an optimum sample rate and for an optimum duration. From the input signals, a new spin speed is calculated according to Equation B described above. This spin speed is sent to the spindle controller to update the high spin speed drying phase. During the drying phase, the new spin speed is applied, forming a coating having the desired, target thickness.

Constant control of the ambient temperature, chill plate temperature and the photoresist temperature at a desired, preset temperature yields a coating having a high uniformity, and decouples the effect of temperature on mean thickness control.

EXAMPLE 1

The invention is further illustrated by the following specific but non-limiting examples wherein procedures described in the past tense have been conducted in the laboratory and procedures described in the present tense have not been carried out in the laboratory.

A two factorial Design of Experiments (DOE) was performed to generate the statistical model with relative humidity and drying step spin speed as inputs and mean film thickness as output. The mean film thickness of every wafer was measured at 49 points by a multiple point thickness measurement tool such as a THERMA WAVE OPTI PRO. Fifteen wafers were coated with SPR508 i-line photoresist under three different spin speeds, 2915, 2650 and 2350 rpm (5 wafers for each spin speed). A baseline recipe was used where average, across the wafer, uniformity was 6.1 Å, 1 sigma. The humidity controller was set to 40 percent. A separate VAISALA humidity sensor was placed near the coater to record the actual air relative humidity and temperature over the coater. The data was recorded every two seconds. The photoresist film mean thickness of each wafer, the average relative humidity during the coating of each wafer, and the drying spin speed were the physical variables measured and recorded. The input and output values were input into the JMP statistical package to obtain the coefficients. The coefficients were obtained by a curve fitting of the predicted model to the data obtained from the experiment. During the experiment, the barometric pressure was measured to vary less than 0.4 mm Hg. This was not significant enough to cause mean thickness variations. Therefore, the model was developed without barometric pressure. With the coefficients developed from the experiment, the model is expressed as:

$$MT = 512.15 - 21.58 \times RH + 529135.5/SS^{1/2}$$

The functional dependence of the mean thickness on the spin speed was taken from analytical solutions to the fluid equations and linear dependence on the relative humidity is an approximation which agrees with the experimental data closely. The confidence level of the fit of the model to the experimental results is very good with a goodness of fit $R^2$ of 0.999249.

For the values determined from the experiment described above in there was no significant change in barometric pressure, Equation B would be expressed as:

$$SS = (529135.5/(MT - 512.15 + 21.58 \times RH))^2$$

EXAMPLE 2

Barometric pressure can change very slowly, e.g., over days or weeks, and, in some instances, relative humidity can change in seconds. Barometric pressure fluctuations can introduce long term variations in the resist film mean thickness. A second experiment was conducted to model the effect of barometric pressure with a constant relative humidity. A two factorial experiment yielded the following model for mean thickness as a function of barometric pressure and spin speed, with relative humidity constant:

$$MT = 12972.5 - 2.2 \times BP + 529135.5/SS^{1/2}$$

For this second experiment, Equation B is expressed as:

$$SS = (529135.5/(MT - 12972.5 + 2.2 \times BP))^2$$

Of course the values of the coefficients developed in the two examples pertain to the particular photoresist used, and would differ for different photoresists having different viscosities. Moreover, while the results of the two examples were obtained by fitting experimental data to the model curve, it is understood that the data could be fit to other such models. What is important to recognize is that the mean thickness is a function of barometric pressure and relative humidity, and mean thickness can be controlled by adjusting spin speed in relation to barometric pressure and relative humidity, rather than to try to hold all quantities constant.

While various embodiments and features of the invention have been described, those skilled in the art will recognize that variations and additions to those features and functions can be made within the scope of the invention. The invention is therefore intended to be limited only by the scope of the appended claims.

The invention claimed is:

1. A process for spin-drying a solution present on a surface, the surface having a central axis thereto, comprising:

(a) determining an operating rotational speed of the surface about the axis as a function of a desired mean thickness of the solution present on the surface, a known relative humidity, and a known barometric pressure according to $$SS = \{\delta/[MT = [+]\alpha = [+]\beta(RH)^m = [+]\zeta(BP)^n]\}^2$$

wherein:
SS is the operating rotational speed of the surface about the axis;
MT is the mean thickness of the solution present on the surface;
RH is the relative humidity;
BP is the barometric pressure;
$\alpha$, $\beta$, $\delta$ and $\zeta$ are real constants, empirically determined by fitting the function to calibration data, with units providing consistency of units among SS, MT, RH and BP; and
m and n are real numbers; and (b) spinning the surface about the central axis at the desired spin speed until the solution has dried.

2. A spin coating process according to claim 1, wherein m=0.

3. A spin coating process according to claim 1, wherein n=0.

4. A spin coating process according to claim 1, wherein m=n=1.

5. A spin coating process according to claim 1, further comprising:

maintaining a temperature at a desired value, wherein the temperature is selected from a group consisting of: an ambient temperature, a temperature of a chill-plate coupled to the surface, and a temperature of the solution.

* * * * *

UNITED STATES PATENT AND TRADEMARK OFFICE
CERTIFICATE OF CORRECTION

PATENT NO. : 6,177,133 B1
DATED : January 23, 2001
INVENTOR(S) : Gurer et al.

Page 1 of 1

It is certified that error appears in the above-identified patent and that said Letters Patent is hereby corrected as shown below:

<u>Title page,</u>
Item (75) Inventors: Emir Gurer, Scotts Valley; Richard Savage, Livermore, both of CA (US)

<u>Column 8,</u>
Line 4, $SS = \{ \delta / [MT - \alpha - \beta(RH)^m - \xi(BP)^n] \}^2$ Signed and Sealed this Twenty fifth Day of September, 2001

Attest:

*Nicholas P. Godici*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,177,133 B1
DATED : January 23, 2001
INVENTOR(S) : Gurer et al.

Page 1 of 1

It is certified that error appears in the above-identified patent and that said Letters Patent is hereby corrected as shown below:

Item [75] Inventors: Emir Gurer, Scotts Valley; Richard Savage, Livermore, both of CA (US)

<u>Column 8,</u>
Line 4, $SS = \{ \delta / [MT - \alpha - \beta(RH)^m - \xi(BP)^n] \}^2$ Signed and Sealed this Twenty-ninth Day of January, 2002

Attest:

JAMES E. ROGAN
*Attesting Officer*     *Director of the United States Patent and Trademark Office*